United States Patent
Akamine et al.

(10) Patent No.: US 7,395,036 B2
(45) Date of Patent: Jul. 1, 2008

(54) SEMICONDUCTOR INTEGRATED CIRCUIT FOR HIGH FREQUENCY POWER AMPLIFIER AND ELECTRIC COMPONENTS WITH THE SEMICONDUCTOR INTEGRATED CIRCUIT

(75) Inventors: Hitoshi Akamine, Maebashi (JP);
Masahiro Tsuchiya, Komoro (JP);
Kyoichi Takahashi, Fujioka (JP);
Kazuhiro Koshio, Komoro (JP)

(73) Assignee: Renesas Technology Corp., Tokyo (JP)

( * ) Notice: Subject to any disclaimer, the term of this patent is extended or adjusted under 35 U.S.C. 154(b) by 491 days.

(21) Appl. No.: 11/216,061

(22) Filed: Sep. 1, 2005

(65) Prior Publication Data

US 2006/0066404 A1    Mar. 30, 2006

(30) Foreign Application Priority Data

Sep. 24, 2004    (JP) .............................. 2004-276260

(51) Int. Cl.
*H01Q 11/12*    (2006.01)
(52) U.S. Cl. .................... 455/126; 455/127.1; 330/133; 330/285
(58) Field of Classification Search ................. 455/126, 455/127.1–127.4; 330/133, 279, 285
See application file for complete search history.

(56) References Cited

U.S. PATENT DOCUMENTS 6,625,429 B1 * 9/2003 Yamashita ................... 455/126
2004/0075501 A1 * 4/2004 Takahashi et al. ........... 330/279

FOREIGN PATENT DOCUMENTS

| JP | 2000-151310 | 5/2000 |
| JP | 2001-016116 | 1/2001 |
| JP | 2004-140518 | 5/2004 |
| WO | 2004/023469 A1 | 3/2004 |

* cited by examiner

*Primary Examiner*—Lee Nguyen
(74) *Attorney, Agent, or Firm*—Mattingly, Stanger, Malur & Brundidge, P.C.

(57) ABSTRACT

In a high frequency power amplifier circuit in which bias voltages are applied to the transistors for amplification by current mirroring, The power amplifier includes a detection circuit including a transistor for detection which receives the AC component of an input signal to the last-stage transistor for amplification at its control terminal, a current mirror circuit which mirrors current flowing through that transistor, and a current-voltage converter which converts current flowing in the slave side of the current mirror circuit into a voltage. In the detection circuit, a voltage from a bias circuit for generating the bias voltages for the transistors for amplification is applied to the control terminal of the transistor for detections, and output of the detection circuit is applied to the control terminal of the last-stage transistor for amplification.

11 Claims, 7 Drawing Sheets

SEMICONDUCTOR INTEGRATED CIRCUIT FOR HIGH FREQUENCY POWER AMPLIFIER AND ELECTRIC COMPONENTS WITH THE SEMICONDUCTOR INTEGRATED CIRCUIT

CROSS-REFERENCE TO RELATED APPLICATION

The present application claims priority from Japanese paten application No. 2004-276260 filed on Sep. 24, 2004, the content of which is hereby incorporated by reference into this application.

BACKGROUND OF THE INVENTION

The invention relates to a technology effective for application to a high frequency power amplifier circuit used in a wireless communication system, such as a cellular phone, and so forth, for amplifying a high frequency transmitting signal to be subsequently outputted, and electronic components with the same mounted therein, and more particularly, to a technology effective for application to an output power detection circuit for executing detection of an output level, necessary for feedback control of an output power.

In general, a high frequency power amplifier circuit for amplifying modulated signals is assembled in an output unit on the sending side of a wireless communication equipment (mobile communication equipment) such as a cellular telephone, and so forth, and with the conventional wireless communication equipment, it has been in practice to detect an output level of a high frequency power amplifier circuit or an antenna to implement feedback of the output level in order to control an amplification factor of the high frequency power amplifier circuit, according to a transmission level required by a baseband circuit or a control circuit of a microprocessor, and so forth (refer to, for example, Patent Document 1). In the past, the detection of the output level has generally been implemented by use of a coupler, a diode detection circuit, and so forth, and a detection circuit has been often made up as a semiconductor integrated circuit separate from the high frequency power amplifier circuit. Since an output power detection system for the conventional high frequency power amplifier circuit makes use of a large number of the semiconductor integrated circuits separate from the high frequency power amplifier circuit, and electronic components, it has been difficult to implement miniaturization of a module.

Further, in the case of a late model cellular telephone, there has been proposed a cellular telephone of a dual-band system capable of handling signals of a system such as DCS (digital Cellular System) using frequencies in, for example, a 1710 to 1785 MHz band besides a system called GSM (Global System for Mobile Communications) for using frequencies in a 880 to 915 MHz band while shifting the phase of a carrier wave by a phase modulation system called GMSK (Gaussian Minimum Shift Keying that shifts the phase of the carrier wave according to transmission data. With a high frequency power amplifier circuit for use in such a cellular telephone as described, since output power amplifiers corresponding to respective bands are provided, there is the need for couplers, and diode detection circuits amplifiers for detecting the respective output levels of the output power amplifiers, corresponding to the respective bands, so that it becomes more difficult to implement miniaturization of the module.

Under the circumstances, the applicant for the present invention has developed the invention relating to a wireless communication system of a current detection scheme, comprising an output detection transistor for receiving an input signal of a power amplification transistor for amplifying a high frequency transmitting signal, and causing a current proportional to a current flowing in the power amplification transistor to flow therein, and a current mirror circuit for transferring the current of the output detection transistor, wherein a current flowing in a receiver of the current of the current mirror circuit is converted into a voltage to serve as a detection signal of an output level, and an output control voltage Vapc corresponding to an input potential difference is generated by comparing the detection signal with an output level directive signal delivered from a baseband circuit, thereby controlling a bias of the power amplification transistor, whereupon the applicant has submitted an application for the same (Patent Document 2).

(Patent Document 1)
JP-A No. 151310/2000.

(Patent Document 2)
International Publication No. WO 2004/023469

SUMMARY OF THE INVENTION

The inventor, et al. have examined a relationship between an output level directive signal Vramp, and an output power Pout in the high frequency power amplifier circuit of the current detection scheme, developed by the applicant. As a result, it has become evident that if sensitivity is set such that control sensitivity in a high output level region becomes optimum, control sensitivity in a low output level region becomes low, resulting in deterioration of precision while if sensitivity is set such that the control sensitivity in the low output level region becomes optimum, the control sensitivity in the high output level region becomes too high, so that the output of a detection circuit becomes saturated in the high output level region, thereby rendering it impossible to control power. Accordingly, the inventor, et al. have developed the invention that has solved the problem described by adoption of a current detection circuit having a characteristic such that the output of the current detection circuit is varied as the n-th root of the input thereof, or a logarithmic function of the input thereof, and have submitted an application for the same (JP-A No. 140518/2004).

The applicant's invention described as above has turned out a technology effective for a system for generating an output control voltage Vapc for controlling gains of power amplifiers, based on the output level directive signal Vramp, and a detection output from an output power detection circuit. However, in the case of the late model cellular telephone of the GSM system and so forth, a system provided with a mode called EDGE (Enhanced Data Rates for GSM Evolution) having $3\pi/8$ rotating 8-PSK (Phase Shift Keying) modulation modes for modulating the phase component as well as the amplitude component of a carrier wave, capable of executing communication by changing over between the modes, besides the GMSK modulation mode, is being put to actual use. As the technology for implementing the PSK modulations of the EDGE mode, there are available a scheme (polar loop scheme) for executing phase modulation in a stage preceding the power amplifiers, and executing amplitude modulation by the power amplifiers, and a scheme (Pin control scheme) for executing phase modulation as well as amplitude modulation in the stage preceding the power amplifiers.

With the Pin control scheme among those schemes, control of an output level as well is executed in the stage preceding the power amplifiers such that when a request output level is high, the amplitude of an input signal to the power amplifiers is increased while when the request output level is low, the amplitude of the input signal to the power amplifiers is decreased. When detection of output power, for feedback control of the output level, is executed by the current detection circuit of the current detection scheme described as above, in a system of the Pin control scheme, it has become evident that there exists a problem of incapability of implementing power control as desired because the control sensitivity in the low output level region is low, and a sufficient detection voltage cannot be obtained even if the technology according to the previous application (JP-A No. 140518/2004) is applied.

Further, there has since been proposed the invention wherein a detection circuit with low sensitivity, and a detection circuit with high sensitivity, for detecting a signal from a coupler, are provided in parallel, and a composite signal made up of respective detection outputs of two detection circuits is used as a detection output as detected (for example, JP A No. 016116/2001). However, in the case where the detection circuit with low sensitivity, and the detection circuit with high sensitivity are provided in parallel as described, there exists a problem in that abrupt variations in step and tilt occur at points of changeover in output of the two detection circuits, thereby rendering it impossible to implement smooth control of the output level.

It is therefore an object of the invention to provide a semiconductor integrated circuit for high frequency power amplifier, capable of executing feedback control of output power with high precision by raising detection sensitivity of an output power detection circuit, in a low output level region, in a wireless communication system for executing the feedback control of the output power by detecting the output level, and electronic components (power module) using the same.

Another object of the invention is to provide a semiconductor integrated circuit for high frequency power amplifier, capable of executing relatively smooth control of output power throughout regions of a low output level, and a high output level, respectively, by preventing abrupt variations in step and tilt from occurring to detection output, in a wireless communication system for executing feedback control of the output power by detecting the output level, and electronic components (power module) using the same.

The above and other objects, features and advantages of the present invention will be apparent from the following detailed description of the present specification in conjunction with the accompanying drawings.

Representative embodiments of the invention, disclosed in the present application, are broadly described as follows.

That is, an output power detection circuit for detecting an output level, necessary for feedback control of an output power, provided in a stage following a high frequency power amplifier circuit for amplifying a high frequency transmitting signal, is made up of two detection circuits capable of detecting an output signal, respectively, consisting of a first detection circuit, and a second detection circuit, the second detection circuit is configured so as to execute detection operation upon receiving an output of the first detection circuit as a bias, and the first detection circuit is set so as to have detection sensitivity higher than detection sensitivity of the second detection circuit, in a low output level region while the first detection circuit is set so as to become saturated at an earlier point in time than the second detection circuit when the output level is controlled so as to be gradually increased.

In this connection, as a method of setting the first detection circuit so as to have a higher detection sensitivity in the low output level region, there are a method of causing input means for inputting an AC component of the output of the high frequency power amplifier circuit to the first and second detection circuits, respectively, to be differentiated in attenuation, that is, in input impedance such that the input impedance of the input means on the side of the second detection circuit is rendered lower than that on the side of the first detection circuit, thereby reducing attenuation of the input AC signal, a method of increasing a mirror ratio of a current mirror circuit constituting the first detection circuit, and so forth.

With adoption of those means described as above, the first detection circuit predominantly operates in the low output level region while the second detection circuit predominantly operates in a high output level region, so that sensitivity of the output power detection circuit, in the low output level region, is enhanced, and control of the output level, can be implemented with high precision throughout a control range by preventing the output of the detection circuit from becoming saturated in the high output level region. Furthermore, since the output of the first detection circuit is given as a bias voltage to the second detection circuit, a detected output can be smoothly changed over. In addition, with the adoption of those means described, even when the invention is applied to the wireless communication system of the above-described Pin control scheme, the sensitivity of the output power detection circuit, in the low output level region, can be sufficiently enhanced.

Now, the first detection circuit, and the second detection circuit each preferably comprises a detection MOS transistor having a gate terminal receiving the AC component of the output of the high frequency power amplifier circuit, extracted by a directional coupling unit, such as a coupler, and so forth, or a capacitance element, a current mirror circuit for transferring a current flowing through the detection MOS transistor, and current-voltage conversion means for converting a current flowing on the transferred side into a voltage, and a resistance element is provided between the detection MOS transistor, and a transistor through which a current at a transfer source of the current mirror circuit is caused to flow. By so doing, the first detection circuit becomes saturated at an earlier point in time than the second detection circuit with greater ease when the output level is controlled so as to be gradually increased.

Advantageous effects of the representative embodiments of the invention, disclosed in the present application, are briefly described as follows.

That is, according to the invention, it is possible to implement the semiconductor integrated circuit for high frequency power amplifier, capable of executing the feedback control of the output power with high precision by raising the detection sensitivity of the output power detection circuit, in the low output level region, in the wireless communication system for executing the feedback control of the output power by detecting the output level, and electronic components (power module) using the same.

Further, according to the invention, it is also possible to implement the semiconductor integrated circuit for high frequency power amplifier, capable of executing relatively smooth control of the output power throughout regions of the low output level, and the high output level, respectively, by preventing abrupt variations in step and tilt from occurring to the detection output, in the wireless communication system for executing the feedback control of the output power by detecting the output level, and electronic components (power module) using the same.

PREFERRED EMBODIMENTS OF THE INVENTION

Preferred embodiments of the invention are described hereinafter with reference to the accompanying drawings.

Figure 1:
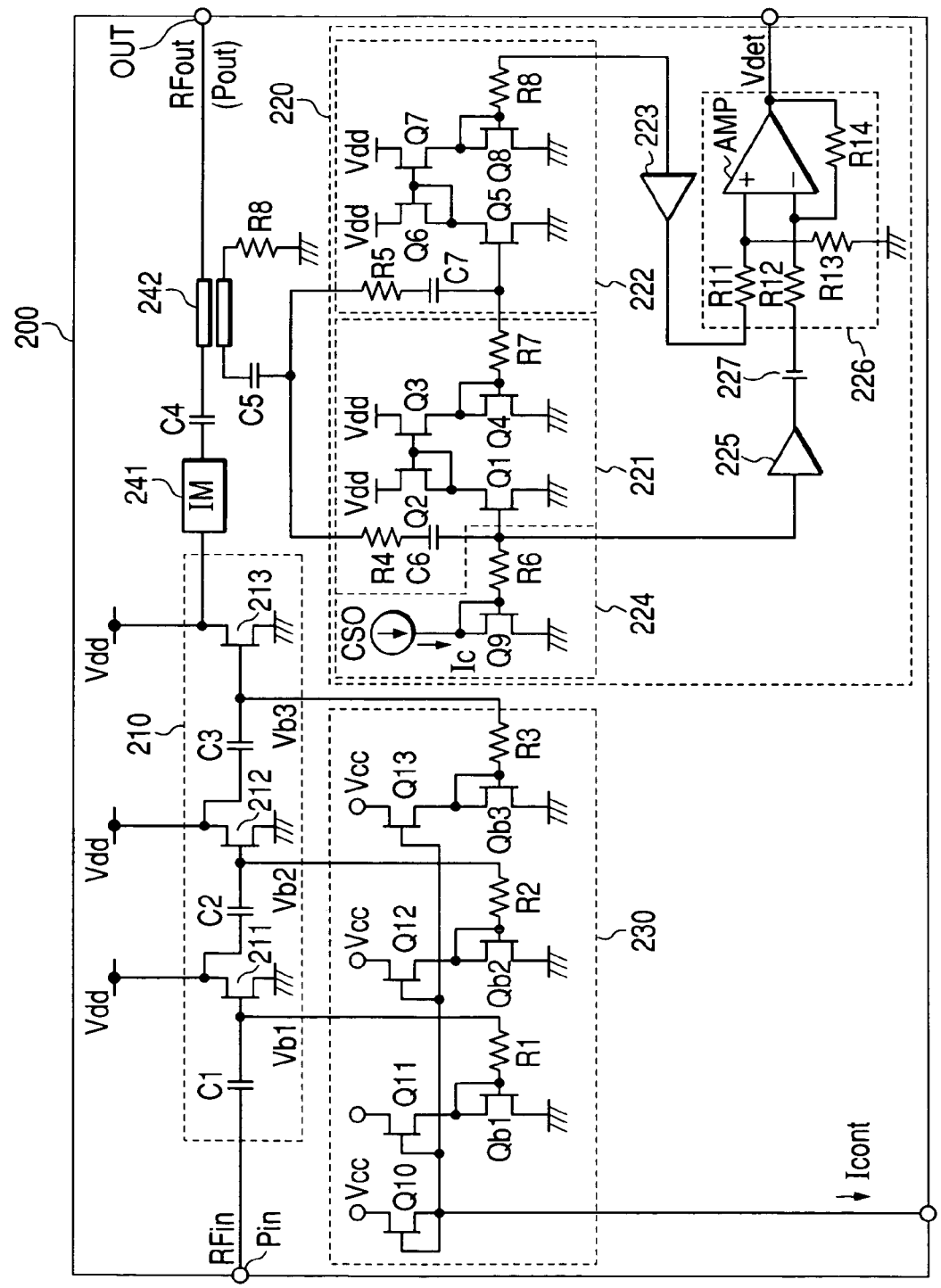
FIG. 1 is a circuit diagram showing a first embodiment of a high frequency power amplifier circuit according to the invention, and an output power detection circuit used therein.

FIG. 1 shows one embodiment of a high frequency power amplifier circuit (hereinafter referred to as a power module) with an output power detection circuit applied thereto, according to the invention. In the present specification, it is to be pointed out that a device with a configuration in which a plurality of semiconductor chips and discrete components are mounted on an insulation board, such as a ceramic board, with printed wiring provided on the surface, and inside, thereof, such that respective components are connected with each other so as to fulfill respective predetermined functions, thereby being enabled to be handled as if one electronic component, is referred to as a module.

A power module 200 according to the present embodiment comprises a high frequency power amplification unit 210 including amplifier FETs for amplifying an input high frequency signal RFin, an output power detection circuit 220 for detecting an output power of the high frequency power amplification unit 210, and a bias circuit 230 for providing the amplifier FETs, in respective stages of the high frequency power amplification unit 210, with a bias voltage, thereby controlling an idling current flowing into the respective FETs.

The high frequency power amplification unit 210 according to the present embodiment has three units of the power amplifier FETs 211, 212, 213, and the FETs 212, 213, in respective following stages each have a gate terminal connected with respective drain terminals of the FETs 211, 212, in respective preceding stages, thereby constituting a three-stage amplification circuit as a whole. Further, respective gate bias voltages Vb1, Vb2, Vb3, supplied from the bias circuit 230, are impressed to the respective gate terminals of the FETs 211, 212, 213, in the respective stages, thereby causing the idling currents corresponding to the respective gate bias voltages to flow into the respective FETs 211, 212, 213.

The bias circuit 230 comprises a MOS transistor Q10 of diode-connection for converting a constant current Icont supplied from outside into a voltage, MOS transistors Q11, Q12, Q13 each having its gate connected in common with the gate of the MOS transistor Q10, thereby constituting a current mirror circuit, and MOS transistors Qb1, Qb2, Qb3, of diode-connection, connected in series to the MOS transistors Q11, Q12, Q13, respectively, and respective currents transferred to Q11, Q12, Q13 are converted into respective voltages by Qb1, Qb2, Qb3, the respective voltages as the bias voltages being impressed to the respective gates of the FETs 211, 212, 213 via resistors R1, R2, R3, respectively.

The MOS transistors Q10, and Q11, Q12, Q13 are set to predetermined size ratios according to the amplifier FETs 211, 212, 213, respectively, so that the idling current corresponding to the constant current Icont supplied from outside is caused to flow into the respective FETs 211, 212, 213. The resistors R1, R2, R3 each fulfill the function of controlling respective currents of the bias transistors Qb1, Qb2, Qb3 so as to prevent the respective currents from undergoing change due to leakage of the high frequency signal from an input terminal. A power source voltage Vdd is impressed to the respective drain terminals of the FETs 211, 212, 213, in the respective stages. A capacitance element C1 for cutting off DC is provided between the gate terminal of the FET 211 in the initial stage, and the input terminal P in. The high frequency signal RFin is delivered to the gate terminal of the FET 211 via the capacitance element C1.

A capacitance element C2 for cutting off DC is coupled between the drain terminal of the FET 211 in the initial stage, and the gate terminal of the FET 212 in a second stage while a capacitance element C3 for cutting off DC is coupled between the drain terminal of the FET 212 in the second stage, and the gate terminal of the FET 213 in the last stage. Further, the drain terminal of the FET 213 in the last stage is connected to an output terminal OUT via an impedance matching circuit 241, and a capacitance element C4, thereby outputting a signal RFout containing an AC component as amplified after cutting off a DC component of the input high frequency signal RFin.

The output power detection circuit 220 according to the present embodiment comprises a first detection circuit 221, a second detection circuit 222, a bias generation circuit 224, buffer circuits 223, 225, a subtraction circuit 226, and so forth. The first detection circuit 221 comprises a capacitor C5 having one of its terminals, connected to a micro-strip line making up a coupler 242 provided half way through an output line between the drain terminal of the FET 213 in the last stage, and the output terminal OUT of the module, a resistor R4 and a capacitor C6, connected in series to the capacitor C5, a detection MOS transistor Q1 having its gate connected to the other end of the capacitor C6, a p-channel MOS transistor Q2 connected in series to the transistor Q1, a MOS transistor Q3 connected in current mirror fashion to the transistor Q2, and a current-voltage conversion MOS transistor Q4 connected in series to the transistor Q3.

The second detection circuit 222 comprises a resistor R5 and a capacitor C7, connected in series to the capacitor C5, a detection MOS transistor Q5 having its gate connected to the other end of the capacitor C7, a p-channel MOS transistor Q6 connected in series to the transistor Q5, a MOS transistor Q7 connected in current mirror fashion to the transistor Q6, and a current-voltage conversion MOS transistor Q8 connected in series to the transistor Q7.

The resistor R4 preferably has a resistance value in a range of about several tens to several hundreds of kΩ, and the resistor R5 preferably has a resistance value in a range of about several hundreds to several thousands of Ω, and the capacitors C6, C7 each preferably have capacitance value on the order of 10 pF. Thus, with the present embodiment, by setting the resistance value of the resistor R5 in the second detection circuit 222 to several tens of times as large as the resistance value of the resistor R4 in the first detection circuit 221, attenuation of an AC signal inputted to the second detection circuit 222 is rendered larger than that of an AC signal inputted to the first detection circuit 221, thereby rendering sensitivity of the first detection circuit 221 higher than that of the second detection circuit 222.

The bias generation circuit 224 gives a gate bias voltage, as an operating point, to the detection MOS transistor Q1 of the first detection circuit 221, and the buffer circuit 225 causes the bias voltage generated by the bias generation circuit 224 to undergo impedance conversion before supplying the bias voltage to the following stage while the buffer circuit 223 causes an output of the second detection circuit 222 to undergo impedance conversion before supplying the output to the following stage. For the buffer circuits 223, 225, respectively, use can be made of a voltage follower. The subtraction circuit 226 comprises a differential amplifier AMP, and resistors R11 to R14, outputting a voltage corresponding to an output of the buffer circuit 223, minus an output of the buffer circuit 225.

Further, the output power detection circuit 220 according to the present embodiment is configured such that a voltage converted by the current-voltage conversion MOS transistor Q4 of the first detection circuit 221 is supplied as a bias voltage giving an operating point to the gate of the detection MOS transistor Q5 of the second detection circuit 222 via a resistor R7. The bias generation circuit 224 comprises a constant current source CSO, a MOS transistor Q9 of diode-connection for converting a constant current Ic from the constant current source CSO into a voltage, and a resistor R6. The constant current source CSO for causing the constant current Ic to flow can be made up of a constant voltage circuit for generating a constant voltage having little temperature dependence such as a band gap reference circuit, a transistor for converting a constant voltage as generated into a current, a current mirror circuit for causing a current proportional to the current flowing in the transistor to flow, and so forth. In place of a configuration incorporating the constant current source CSO as an internal circuit, a configuration may be adopted wherein a constant current is supplied from outside of the chip. Further, a constant voltage instead of the constant current may be supplied from outside of the chip. In the case of supplying the constant voltage, it need only be sufficient to connect a resistor in series with the transistor Q9, instead of the constant current source CSO in FIG. 1.

With the present embodiment, as a gate bias voltage value of the detection MOS transistor Q1 of the first detection circuit 221, a voltage value close to the threshold voltage of the transistor Q1 is set so as to enable the transistor Q1 to undergo class B amplification. By so doing, a current proportional to the AC signal inputted via the capacitor C6, and subjected to half-wave rectification is caused to flow through the detection MOS transistor Q1, so that a drain current of Q1 comes to contain a DC component proportional to amplitude of the AC signal inputted.

The drain current of Q1 is transferred to the side of Q3 via a current mirror circuit made up of Q2 and Q3, and is converted into a voltage by the transistor Q4 of diode-connection. In this connection, the MOS transistors Q1, Q4, and Q2, Q3 are set so as to be at a predetermined size ratio, respectively. Consequently, if there occurs variations in characteristics (threshold voltage, in particular) of the MOS transistors Q1, Q2, respectively, due to, for example, manufacturing variations, this will cause similar variations in respective characteristics of the MOS transistors Q4, Q3, that form a pair with Q1, Q2, respectively. As a result, effects due to the variations in characteristics are offset by each other, so that a detected voltage insusceptible to the effects due to the variations in characteristics of the MOS transistors comes to appear at the drain terminal of the MOS transistor Q4. The same applies to the second detection circuit 222.

Further, with the present embodiment, a voltage identical to the bias voltage generated by the bias generation circuit 224, and impressed to the gate terminal of the detection MOS transistor Q1 is supplied to the subtraction circuit 226 via the buffer circuit 225, and a voltage obtained by subtracting the bias voltage from the output of the second detection circuit 222 is outputted from the subtraction circuit 226. Consequently, an output of the subtraction circuit 226 will be a detection voltage Vdet proportional to a pure AC component of the output power, not containing a DC component given by the bias generation circuit 224.

Furthermore, the output power detection circuit 220 according to the present embodiment has a voltage source 227 for giving a DC offset Voff, provided in a stage following the buffer circuit 225 for conveying the bias voltage generated by the bias generation circuit 224 to the subtraction circuit 226, thereby slightly lowering a potential at an inverting input terminal of the amplifier of the subtraction circuit 226. The reason for this is because a baseband circuit for supplying an output level directive signal Vramp to an APC circuit (refer to FIG. 9) for controlling the output level has characteristics such that there can be the case where the baseband circuit cannot output the signal Vramp fully at 0V even in the case where the same wants to turn the output level to "0", and in such a case, if the detection voltage Vdet supplied from the output power detection circuit 220 to the APC circuit is at 0V, a control voltage Vapc delivered from the APC circuit becomes higher than 0V, thereby raising the risk of the output power Pout being sent out. A position where the DC voltage source 227 is provided may be between the buffer circuit 223 and the subtraction circuit 226.

Now, with the power module 200 according to the present embodiment, respective elements (excluding the capacitance elements C1 to C3. each for cutting off DC) of the power amplification unit 210, respective elements of the bias circuit 230, and respective elements (excluding the capacitor C5) of the output power detection circuit 220 are constituted as a semiconductor integrated circuit on a single piece of semiconductor chip such as a single crystal silicon. The semiconductor integrated circuit, the capacitance elements C1 to C3 of the power amplification unit 210, the impedance matching circuit 241, the capacitance element C4 for cutting off DC, the coupler 242, and the capacitor C5 of the output power detection circuit 220 constitute the power module mounted on one ceramic board. An inductor constituting the impedance matching circuit 241 can be formed of a bonding wire interconnecting pads of the semiconductor chip, or a micro-strip line formed on the module board.

As described in the foregoing, in the case of the power module to which an output power detection system is applied, according to the present embodiment, the output power detection circuit 220, together with the high frequency power amplification unit 210, and the bias circuit 230 thereof, can be easily made into the semiconductor integrated circuit, so that it becomes possible to reduce a component count, thereby enabling the module to be miniaturized. Further, the semiconductor integrated circuit according to the present embodiment can be configured such that there is provided an error amplifier (the APC circuit) for comparing the detection voltage Vdet as detected by the output power detection circuit 220 with the output level directive signal Vramp delivered from the baseband circuit, and generating an output control voltage Vapc corresponding to a potential difference therebetween, thereby supplying the output control voltage Vapc generated by the error amplifier to the bias circuit 230 to cause the bias voltages Vb1 to Vb3 of the high frequency power amplification unit 210 to be generated.

Next, there are described hereinafter the characteristics of the high frequency power amplifier circuit to which the output power detection circuit according to the present embodiment is applied.

Figure 2:
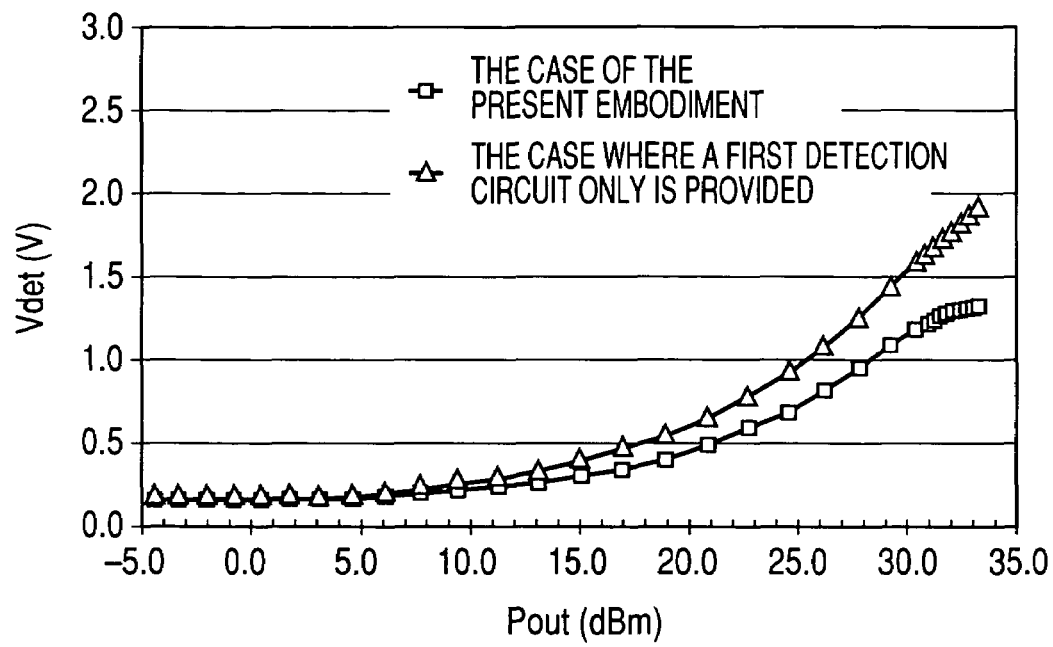
FIG. 2 is an output power Pout—detection voltage Vdet plot showing a relationship between the output power Pout and the detection voltage Vdet in the case where the output power detection circuit according to the first embodiment is applied, and a relationship between the output power Pout and the detection voltage Vdet, in the case where use is made of a circuit formed by omitting a second detection circuit of the output power detection circuit according to the first embodiment.
Figure 3:
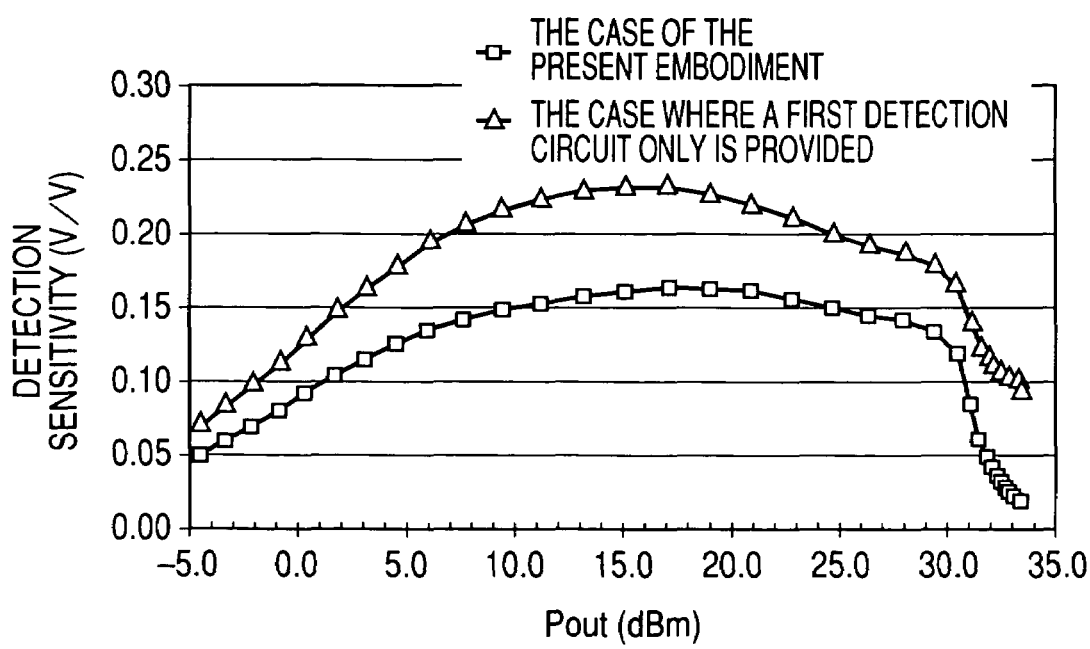
FIG. 3 is an output power Pout—detection sensitivity plot showing a relationship between the output power Pout and the detection sensitivity in the case where the output power detection circuit according to the first embodiment is applied, and a relationship between the output power Pout and the detection sensitivity in the case where use is made of the circuit formed by omitting the second detection circuit of the output power detection circuit according to the first embodiment.

FIG. 2 shows a relationship between the output power Pout and the detection voltage Vdet in the output power detection circuit 220 according to the present embodiment, and FIG. 3 shows a relationship between the output power Pout and detection sensitivity in the output power detection circuit 220 according to the present embodiment.

In FIG. 2, symbols Δ indicate the relationship between the output power Pout and the detection voltage Vdet as plotted when the output power detection circuit 220 according to the present embodiment is applied while symbols □ indicate the relationship between the output power Pout and the detection voltage Vdet as plotted, when use is made of a circuit having only the first detection circuit 221 by omitting the second detection circuit 222 from the output power detection circuit 220.

In FIG. 3, symbols Δ indicate the relationship between the output power Pout and the detection sensitivity as plotted when the output power detection circuit 220 according to the present embodiment is applied while symbols □ indicate the relationship between the output power Pout and the detection sensitivity as plotted when use is made of the circuit having only the first detection circuit 221.

It is evident from FIG. 2 that with the application of the present embodiment, a high detection voltage Vdet as compared with the case of only the first detection circuit being in use can be obtained in a region where the output power Pout is at a level not lower than 15 dBm. Further, It is evident from FIG. 3 that with the application of the present embodiment, the detection sensitivity of the output power detection circuit 220 can be enhanced throughout low to high level regions of the output power Pout, as compared with the case of only the first detection circuit being in use.

Figure 4:
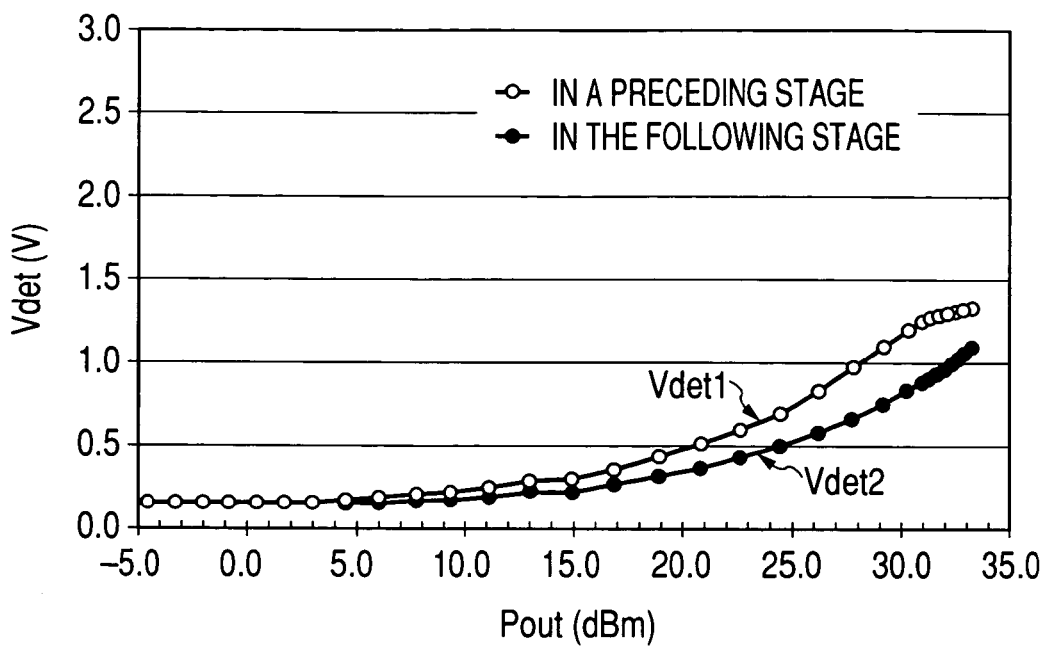
FIG. 4 is an output power Pout—the detection voltage Vdet plot showing a relationship between the output power Pout and a detection voltage Vdet1 of the first detection circuit 221 in the case where the output power detection circuit according to the first embodiment is applied and a relationship between the output power Pout and a detection voltage Vdet2 of the second detection circuit when it is assumed that an input high frequency signal Rfin has an effect on the output power detection circuit only, and the input high frequency signal Rfin has no effect on amplifier FETs.
Figure 5:
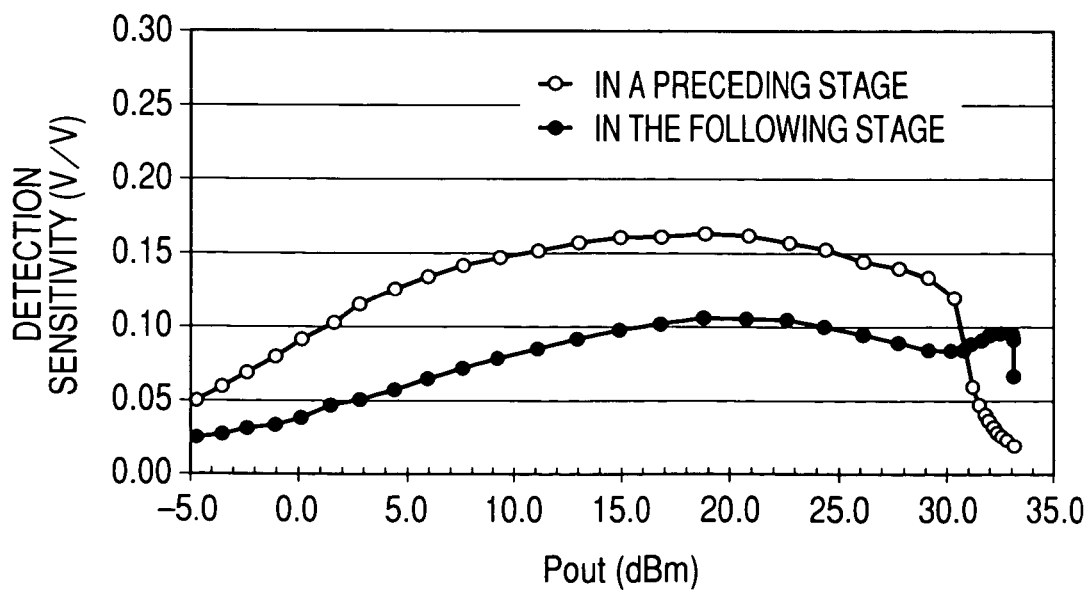
FIG. 5 is an output power Pout—detection sensitivity plot showing a relationship between the output power Pout and the detection sensitivity of the first detection circuit 221 when the output power detection circuit according to the first embodiment is applied, and a relationship between the output power Pout and detection sensitivity of the second detection circuit when it is assumed that the input high frequency signal Rfin has the effect on the output power detection circuit only, and the input high frequency signal Rfin has no effect on amplifier FETs.

FIG. 4 shows a relationship between the output power Pout and the detection voltage Vdet in the output power detection circuit 220 according to the present embodiment, and FIG. 5 shows a relationship between the output power Pout and the detection sensitivity in the output power detection circuit 220 according to the present embodiment.

In FIG. 4, symbols ○ indicate a relationship between the output power Pout and a detection voltage Vdet1 of the first detection circuit 221, as plotted, when the output power detection circuit 220 according to the present embodiment is applied while symbols ● indicate a relationship between the output power Pout and a detection voltage Vdet2 of the second detection circuit 222, as plotted, when the output power detection circuit 220 according to the present embodiment is applied. It is evident from FIG. 4 that the detection voltage Vdet1 of the first detection circuit 221 becomes nearly saturated in a region of the output power Pout at not lower than 30 dBM, but the detection voltage Vdet2 of the second detection circuit 222 is found increasing in rate of change even in the region of the output power Pout at not lower than 30 dBM.

In FIG. 5, symbols ○ indicate a relationship between the output power Pout and the detection sensitivity of the first detection circuit 221, as plotted, when the output power detection circuit 220 according to the present embodiment is applied while symbols ● indicate a relationship between the output power Pout and the detection sensitivity of the second detection circuit 222, as plotted, when the output power detection circuit 220 according to the present embodiment is applied. It is evident from FIG. 5 that the detection sensitivity of the first detection circuit 221 is high in a region of the output power Pout at not higher than 30 dBM, and abruptly undergoes deterioration when the output power Pout exceeds 30 dBM, but the detection sensitivity of the second detection circuit 222 is small in deterioration even in the region of the output power Pout at not lower than 30 dBM.

The detection voltage Vdet as detected by the output power detection circuit 220 having the characteristics described as above is supplied to the baseband circuit, and so forth, thereby controlling amplitude of the transmitting signal inputted to the high frequency power amplification unit 210 in FIG. 1, so that it becomes possible to control the output power with high precision throughout the low level to high level regions of the output power Pout, as compared with the case of only the first detection circuit 221 being in use.

Figure 6:
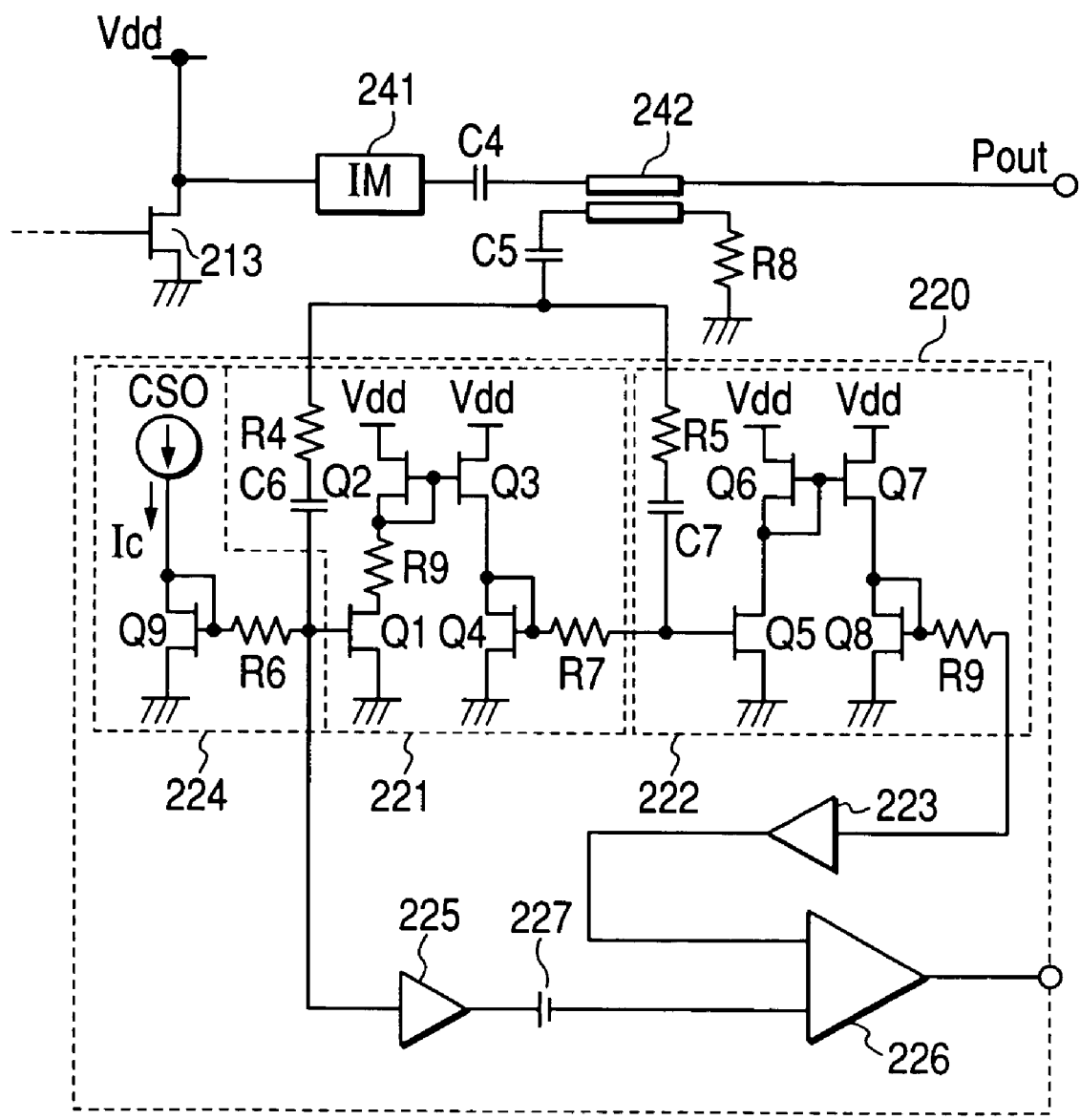
FIG. 6 is a circuit diagram showing a variation example of the high frequency power amplifier circuit according to the first embodiment of the invention.

With the present embodiment, the detection MOS transistor Q1 of the first detection circuit 221 is directly connected to the transistor Q2 through which a current of the transfer source of the current mirror circuit is caused to flow, however, such a configuration may be modified such that a resistor R9 is provided between the transistors Q1, and Q2, as shown in FIG. 6, so that the output of the first detection circuit 221 becomes saturated at an earlier point in time than the second detection circuit 222 when the output level is controlled so as to be gradually increased. By so doing, better sensitivity characteristic can be obtained.

Figure 7:
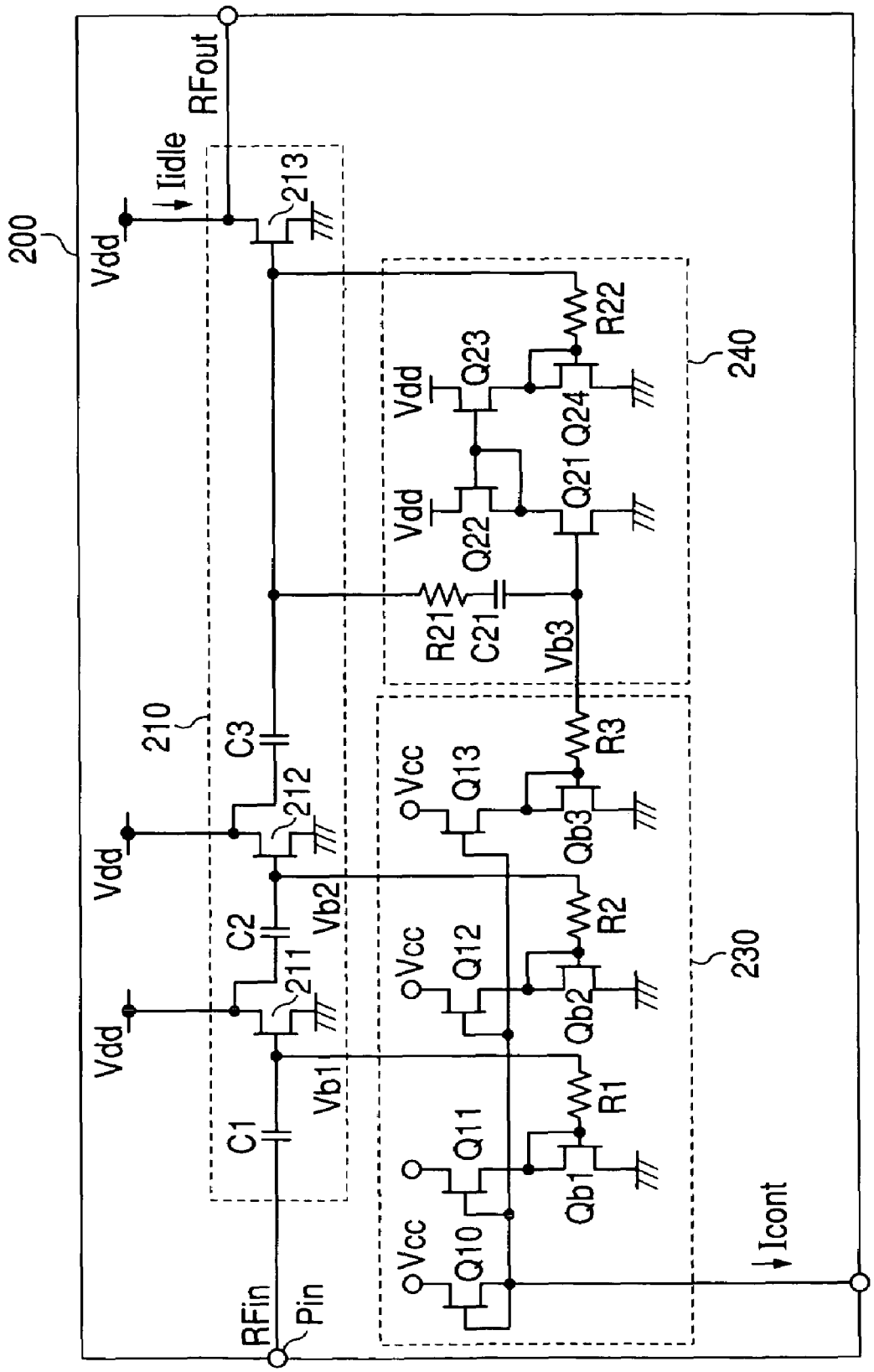
FIG. 7 is a circuit diagram showing a second embodiment of a high frequency power amplifier circuit according to the invention.

FIG. 7 shows another embodiment of a high frequency power amplifier circuit according to the invention.

With the high frequency power amplifier circuit according to this embodiment, between the gate terminal of a bias MOS transistor Qb3 in a third stage of a bias circuit 230, and the gate terminal of an FET 213 in the last stage, there is provided a self-bias detection circuit 240 for detecting an RF signal inputted from an FET 212 in a second stage, and generating a voltage corresponding to a level of the RF signal, and a voltage converted by the bias transistor Qb3 to subsequently impress the voltage generated to the gate terminal of the FET 213, thereby increasing the idling current.

The detection circuit 240 comprises a detection MOS transistor Q21 having its gate connected to a node halfway through a signal line interconnecting the drain terminal of the FET 212 in the second stage, and the gate terminal of the FET 213 in the last stage via a resistor R21 and a capacitor C21, forming a series circuit, a p-channel MOS transistor Q22 connected in series to the transistor Q21, a MOS transistor Q23 connected in current mirror fashion to the transistor Q22, and a current-voltage conversion MOS transistor Q24 connected in series to the transistor Q23. The resistor R21 preferably has a resistance value in a range of about several tens to several hundreds of k$\Omega$, and the capacitor C21 preferably has capacitance value on the order of 10 pF.

The detection circuit 240 according to the present embodiment is configured such that the voltage converted by the bias MOS transistor Qb3 in the third stage of the bias circuit 230 is supplied to the gate terminal of the detection MOS transistor Q21 via a resistor R3, as a gate bias voltage giving an operating point thereto. As a gate voltage value of the detection MOS transistor Q21, a voltage value close to the threshold voltage of the transistor Q21 is set so as to enable the transistor Q21 to undergo class B amplification. By so doing, a current proportional to an AC signal inputted via the capacitor C21, and subjected to half-wave rectification is caused to flow through the detection MOS transistor Q21, so that a drain current of Q21 comes to contain a DC component proportional to the amplitude of the AC signal inputted.

The drain current of Q21 is transferred to the side of Q23 via a current mirror circuit made up of Q22 and Q23, and is converted into a voltage by the transistor Q24 diode-connected to Q23. The voltage described is impressed to the gate terminal of the FET 213 in the last stage, thereby causing an idling current Iidle corresponding to the voltage to flow. Accordingly, as an inputted high frequency signal RFin increases in amplitude, so does an output voltage of the detection circuit 240, resulting in an increase of the idling current Iidle of the power amplifier FET 213. That is, it is possible to cause the idling current, corresponding to the amplitude of the input high frequency signal RFin, to flow into the power amplifier FET 213.

Accordingly, when the high frequency power amplifier circuit according to the present embodiment is applied, by setting in advance a bias current flowing in the bias transistor Qb3 to less than that in the case where the detection circuit 240 is not provided, it is possible not only to enhance power efficiency at the time of low output when the inputted high frequency signal RFin is small in amplitude, but also to cause much of the idling current to flow at the time of high output when the inputted high frequency signal RFin is large in amplitude, thereby obtaining desired output power, while reducing distortion in output waveform.

Figure 8:
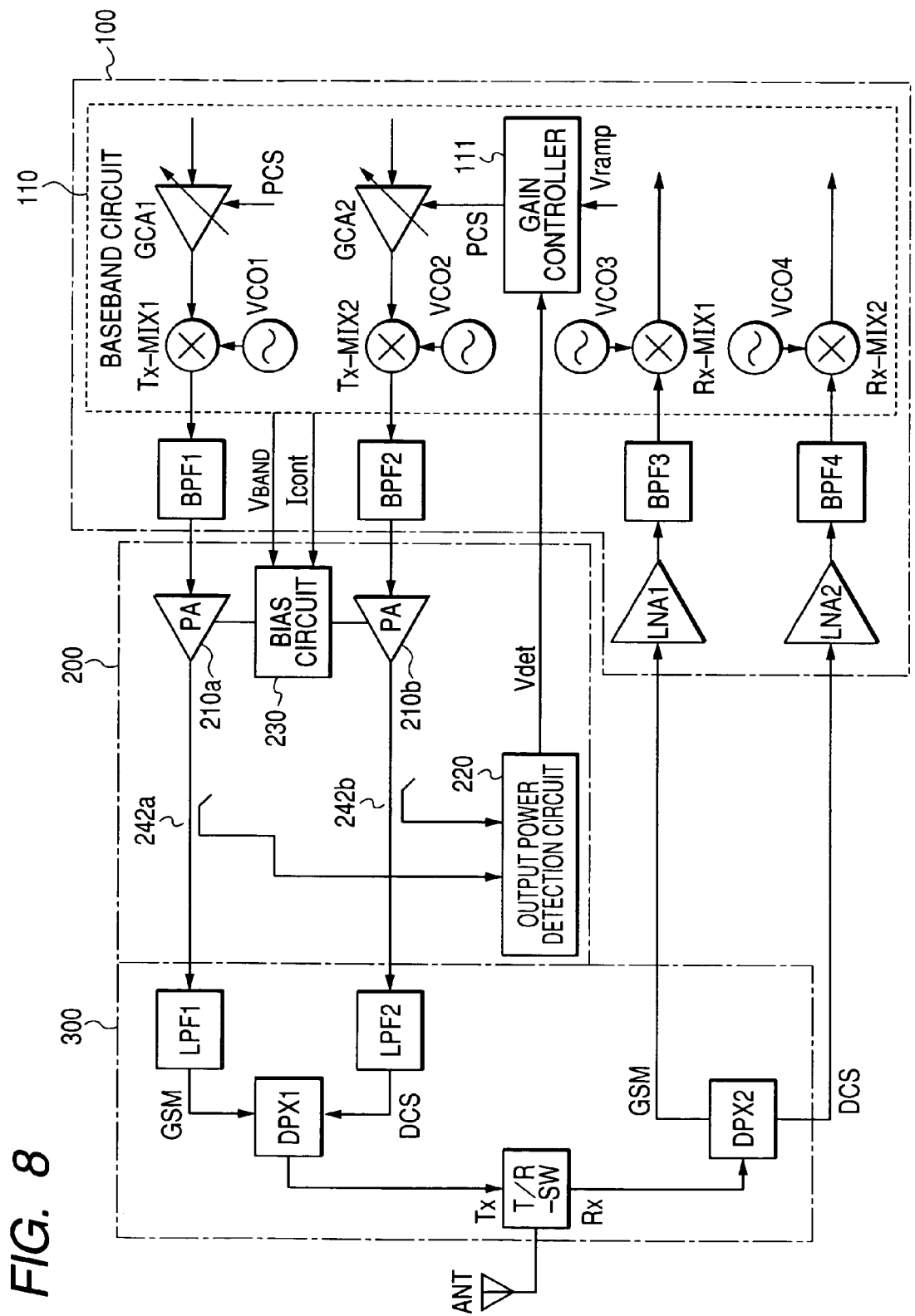
FIG. 8 is a block diagram broadly showing a configuration of an example of a wireless communication system to which the high frequency power amplifier circuit (power module) according to the present invention can be effectively applied.

FIG. 8 broadly shows a configuration of an example of a system, capable of wireless communication using two communication systems of GSM and DCS, as an example of a wireless communication system to which the power module according to the present embodiment can be effectively applied.

In FIG. 8, ANT is an antenna for transmitting and receiving signal waves, and reference numeral 100 denotes an electronic device (hereinafter referred to as an RF device) comprising a high frequency signal processing circuit (hereinafter referred to as a baseband IC) 110 made into a semiconductor integrated circuit, having a modem circuit capable of GMSK modulation/demodulation in the GSM and DCS systems, and PSK modulation/demodulation of the EDGE mode, and a circuit for generating I, Q signals based on transmission data (baseband signal), and processing the I, Q signals extracted from a received signal, low noise amplifiers LNA1, LNA2, for amplifying the received signal, band-pass filters BPF1, BPF2, for removing harmonic components from the received signal, band-pass filters BPF3, BPF4, for removing unnecessary waves from the received signal, and so forth, all those constituents being mounted in one package. The low noise amplifiers LNA1, LNA2 can be incorporated in the baseband IC 110.

The baseband IC 110 further comprises mixers Tx-MIX1, Tx-MIX2, for up-converting respective transmitting signals of GSM, DCS, Rx-MIX1, Rx-MIX2, for down-converting the respective received signals of GSM, DCS, oscillators VCO1 to VCO4, for generating respective oscillation signals to be mixed with the transmitting signals, and received signals, respectively, in those mixers, variable gain amplifiers GCA1, GCA2, for amplifying the respective transmitting signals of GSM, DCS, and a gain controller 111 for controlling respective gains of those amplifiers, thereby outputting signals with desired amplitudes.

In FIG. 8, reference numeral 200 denotes the power module according to the previously described embodiment, for amplifying the high frequency transmitting signals supplied from the baseband IC 110, and reference numeral 300 denotes a front-end module comprising filters LPF1, LPF2, for removing noises, such as harmonics, and so forth, contained in the transmitting signals, branching filters DPX1, DPX2, for combining the GSM signal with the DCS signal, and separating the GSM signal from the DCS signal, a switch T/R-SW for switching over between transmitting and receiving of signals, and so forth. The power module 200 is provided with a high frequency power amplifier circuit 210a for GSM and a high frequency power amplifier circuit 210b for DCS.

As shown in FIG. 8, with the present embodiment, a mode select signal VBAND indicating whether a select mode is GSM or DCS, and the constant current Icont are supplied from the baseband IC 110 to a bias circuit 230 for the high frequency power amplifier circuits (hereinafter referred to as power amplifiers) 210a, 210b, and the bias circuit 230 generates a bias current corresponding to a mode selected, on the basis of the select signal VBAND, and the constant current Icont, thereby supplying the bias current to either the power amplifier 210a, or the power amplifier 210b. The bias circuit 230 in FIG. 8 is a circuit comprising the current mirror circuits made up of the transistors Q10 to Q13, in FIG. 1, respectively, and a circuit made up of the bias transistors Qb1, Qb2, Qb3, in FIG. 1, provided for use in GSM, and DCS, respectively, and a select circuit, etc. added thereto.

Further, with the present embodiment, the detection voltage Vdet outputted by the output power detection circuit 220 provided inside the power module 200 is supplied to the gain controller 111 of the baseband IC 110, whereupon the gain controller 111 compares the detection voltage Vdet with the output level directive signal Vramp from inside, and generates a power control signal PCS for the variable gain amplifiers GCA1, GCA2, respectively, to thereby control respective gains thereof, according to which respective amplitudes of high frequency signals inputted to the power amplifiers 210a, 210b, respectively, are controlled.

With the above-described dual-band communication system consisting of GSM, and DCS, since the maximum level of the output power of the power amplifier 210a on the side of GSM, and the maximum level of the output power of the power amplifier 210b on the side of DCS are defined by respective standards, differing from each other. Consequently, the output power detection circuit 220 in FIG. 8 is provided with detection circuits of the same configuration as shown in FIG. 1, for use in GSM, and DCS, respectively, although not shown in FIG. 8, thereby being configured so as to enable either GSM, or DCS to be selectively set to an operating state according to the select signal VBAND.

Figure 9:
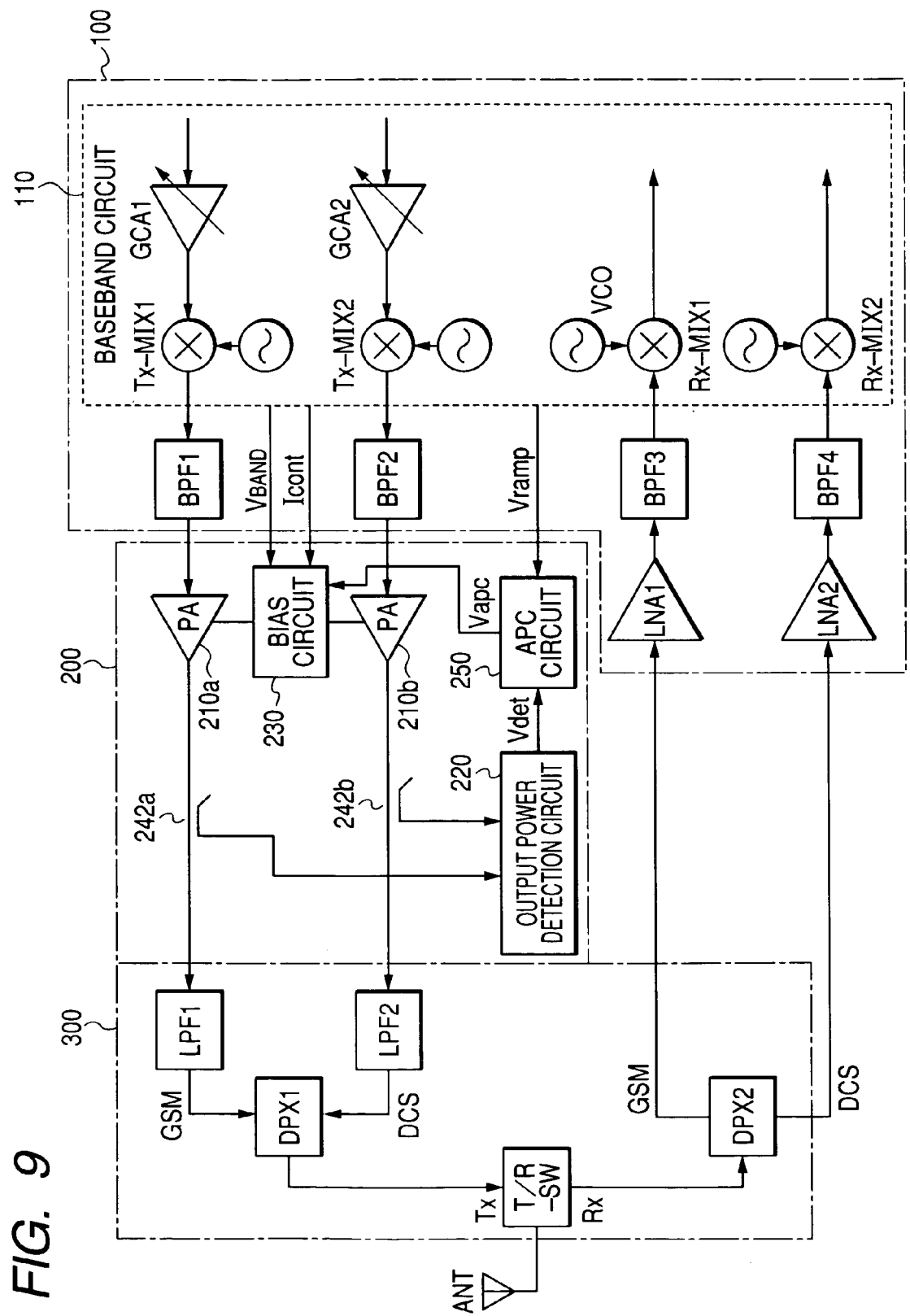
FIG. 9 is a block diagram broadly showing a configuration of another example of a wireless communication system to which the high frequency power amplifier circuit according to the present invention can be suitably applied.

FIG. 9 broadly shows a configuration of a system, to which a high frequency power amplifier circuit incorporating the error amplifier (the APC circuit) in addition to the configuration of the preceding embodiment of the invention is effectively applied. This applied system also is configured so as to serve as a system capable of wireless communication using the two communication systems of GSM and DCS although the invention is not particularly limited thereto. In FIG. 9, circuits and a device corresponding to those in FIG. 8 are denoted by like reference numerals, thereby omitting duplication in description.

As shown in FIG. 9, with the present embodiment, a mode select signal VBAND, indicating whether a select mode is GSM or DCS, is supplied from a baseband IC 110 to a bias circuit 230, and the bias circuit 230 generates a bias current corresponding to a mode selected, on the basis of the select signal VBAND, thereby supplying the bias current to either the power amplifier 210a, or the power amplifier 210b. Further, the output level directive signal Vramp is supplied from the baseband IC 110 to an APC circuit (the error amplifier) 250 inside the power module 200, and the APC circuit (the error amplifier) 250 compares the output level directive signal Vramp with the detection voltage Vdet as detected by the output power detection circuit 220, thereby generating an output control voltage Vapc for the bias circuit 230, whereupon the bias circuit 230 controls respective gains of the power amplifiers 210a, 210b, according to the output control voltage Vapc, according to which control is implemented such that respective output powers of the power amplifiers 210a, 210b undergo a change.

With the system in FIG. 8 as well as FIG. 9, the mixers Tx-MIX1, Tx-MIX2 are provided in a stage following the variable gain amplifiers GCA1, GCA2, respectively, however, the mixers Tx-MIX1, Tx-MIX2 may be provided in a stage preceding the variable gain amplifiers GCA1, GCA2, respectively. Furthermore, besides the above-described device and module, there may be provided a microprocessor (CPU) for controlling the system in whole by generating an output level directive signal serving as a basis for a control signal and a power control signal for an RF device 100 although not shown in FIG. 8 and FIG. 9.

Having specifically described the invention developed by the inventor, et al. with reference to the embodiments as above, it is to be understood that the invention is not limited to those embodiments, and that various changes and modifications may obviously be made in the invention without departing from the spirit and scope thereof. For example, with the embodiments described, by setting the resistance value of the resistor R5 in the second detection circuit 222 to several tens of times as large as the resistance value of the resistor R4 in the first detection circuit 221, the attenuation of the AC signal inputted to the second detection circuit 222 is rendered larger than that of the AC signal inputted to the first detection circuit 221, thereby rendering the sensitivity of the first detection circuit 221 higher than that of the second detection circuit 222, however, it is also possible to render the sensitivity of the first detection circuit 221 higher than that of the second detection circuit 222 by setting a size ratio of the transistors Q2, Q3 of the current mirror circuit of the first detection circuit 221, to, for example, as large as 1:10, or setting a size ratio of the detection MOS transistors Q1, Q5 to, for example, as large as 1:2 while keeping a size ratio of the transistors Q6, Q7 of the current mirror circuit of the second detection circuit 222, to, for example, 1:1.

Further, with the embodiments described, an FET is used for the respective amplifier transistors 211 to 213 of the high frequency power amplification unit, however, transistors other than the FET, such as a bipolar transistor, GaAs MES FET, hetero-bipolar transistor (HBT), HEMT (High Electron Mobility Transistor, and so forth, can be used for the respective amplifier transistors 211 to 213. Still further, with the embodiments described, there has been shown the case where the high frequency power amplification unit has three amplification stages, however, the number of the amplification stages thereof may be one, or two. Furthermore, the current-voltage conversion MOS transistor Q4, Q8, as respective constituent members of the first detection circuit 221, and second detection circuit 222, may be resistors, respectively.

Still further, with the embodiments described, the bias circuit 230 for generating the respective gate biases of the power amplifier FETs 211 to 213 of the high frequency power amplification unit 210 has been shown to have a configuration such that the constant current Icont is received from outside, and the idling current is caused to flow into the respective FETs 211 to 213 via the respective mirror circuits, however, the bias circuit 230 may be made up of a resistance type potential divider for generating the respective gate biases of the power amplifier FETs 211 to 213 by dividing the constant current Icont supplied from outside with the use of resistors.

Furthermore, with the embodiments described, there has been adopted a configuration wherein the AC component of the output of the high frequency power amplification unit 210 is taken out via the coupler 242, however, the invention can be applied to the case where the high frequency power amplification unit 210 is configured such that the AC component of the output of the high frequency power amplification unit 210 is taken out by the capacitor having one of the terminals thereof, connected to the micro-strip line making up the impedance matching circuit 241 provided on the output line of the high frequency power amplification unit 210.

INDUSTRIAL APPLICABILITY

While there have been described hereinbefore mainly the cases where the invention developed by the inventor, et al. is applied to the high frequency power amplifier circuit, and the power module for use in the cellular phone, as the field of application, which is the background of the invention, it is to be pointed out that the invention is not limited thereto, and that the invention can be applied to a high frequency power amplifier circuit, power module, and so forth, constituting a wireless LAN.

What is claimed is:

1. A semiconductor integrated circuit for high frequency power amplifier comprising:
    a high frequency power amplifier circuit for amplifying a high frequency transmitting signal;
    a first detection circuit for detecting an output of the high frequency power amplifier circuit, and generating a voltage corresponding to the output; and
    a second detection circuit having detection sensitivity lower than detection sensitivity of the first detection circuit, in a low output level region, for executing detection operation upon receiving an output of the first detection circuit, and the output of the high frequency power amplifier circuit,
    wherein a voltage or current, corresponding to an output of the second detection circuit is outputted.

2. A semiconductor integrated circuit for high frequency power amplifier according to claim 1, further comprising:
- a first input means for causing an AC component of the output of the high frequency power amplifier circuit to be inputted to the first detection circuit; and
- a second input means for causing the AC component of the output of the high frequency power amplifier circuit to be inputted to the second detection circuit,
- wherein the second input means is set larger in attenuation than the first input means, thereby causing the second detection circuit to have detection sensitivity lower than that of the first detection circuit, in the low output level region.

3. An integrated circuit for high frequency power amplifier according to claim 2, wherein the first input means, and the second input means each are made up of a resistance element, and a capacitance element, forming a series circuit, and a resistance value of the resistance element of the second input means is set higher than a resistance value of the resistance element of the first input means, thereby causing a signal of the second input means to be greater in attenuation than a signal of the first input means.

4. A semiconductor integrated circuit for high frequency power amplifier comprising:
- a high frequency power amplifier circuit for amplifying a high frequency transmitting signal;
- a first detection circuit for detecting an output of the high frequency power amplifier circuit, and generating a voltage corresponding to the output; and
- a second detection circuit for detecting the output of the high frequency power amplifier circuit as biased by the voltage outputted by the first detection circuit,
- wherein a voltage or current, corresponding to an output of the second detection circuit is outputted.

5. A semiconductor integrated circuit for high frequency power amplifier according to claim 4, further comprising:
- a first input means for causing an AC component of the output of the high frequency power amplifier circuit to be inputted to the first detection circuit; and
- a second input means for causing the AC component of the output of the high frequency power amplifier circuit to be inputted to the second detection circuit,
- wherein the second input means is set larger in attenuation than the first input means, thereby causing the second detection circuit to have detection sensitivity lower than that of the first detection circuit, in a low output level region.

6. A semiconductor integrated circuit for high frequency power amplifier according to claim 5, wherein the first input means, and the second input means each are made up of a resistance element, and a capacitance element, forming a series circuit, and a resistance value of the resistance element of the second input means is set higher than a resistance value of the resistance element of the first input means, thereby causing a signal of the second input means to be greater in attenuation than a signal of the first input means.

7. A semiconductor integrated circuit for high frequency power amplifier according to claim 4, wherein the first detection circuit, and the second detection circuit each comprises a first transistor having a control terminal receiving an AC component of the output of the high frequency power amplifier circuit, a second transistor connected in series to the first transistor, a third transistor, together with the second transistor, constituting a current mirror circuit, and current-voltage conversion means for converting a current flowing through the third transistor into a voltage to be thereby outputted, and the first detection circuit has a resistance element connecting the first transistor to the second transistor, thereby causing the first detection circuit to become saturated at an earlier point in time than the second detection circuit.

8. A semiconductor integrated circuit for high frequency power amplifier according to claim 4, further comprising a bias generation circuit for generating a bias voltage of the first detection circuit,
- wherein a voltage which is obtained by subtracting the bias voltage from the output of the second detection circuit is outputted as a detection result.

9. A semiconductor integrated circuit for high frequency power amplifier according to claim 4, further comprising:
- a third detection circuit which detects an input of an amplifier transistor in the last stage of the high frequency power amplifier circuit, the third detection circuit being coupled to a control terminal of the amplifier transistor; and
- a bias circuit which generates a bias voltage for the amplifier transistor,
- wherein a voltage corresponding to the bias voltage and an output of the third detection circuit is inputted to the control terminal of the amplifier transistor, thereby causing an idling current corresponding to a level of the input high frequency signal to flow.

10. An electronic component for high frequency power amplifier, comprising a semiconductor integrated circuit for high frequency power amplifier according to claim 1, and AC component extraction means provided on an output line of the high frequency power amplifier circuit, for extracting the AC component of the output of the high frequency power amplifier circuit, both constituents being mounted on one insulation board.

11. A wireless communication system comprising:
- an electronic component for high frequency power amplifier according to claim 10;
- a second electronic component having a transmitting-receiving switchover means for switching over between transmitting and receiving signals; and
- a third electronic component for modulating a signal to be transmitted before inputting the signal to the electronic component for high frequency power amplifier,
- wherein the output as detected is supplied from the electronic component for high frequency power amplifier to the third electronic component, and the third electronic component controls amplitude of the transmitting signal to be inputted to the electronic component for high frequency power amplifier on the basis of the output as detected and a signal indicating a request output level.

* * * * *